(12) United States Patent
Templeton et al.

(10) Patent No.: US 6,552,790 B1
(45) Date of Patent: *Apr. 22, 2003

(54) SYSTEM AND METHOD FOR FACILITATING WAFER ALIGNMENT BY MITIGATING EFFECTS OF RETICLE ROTATION ON OVERLAY

(75) Inventors: Michael K. Templeton, Atherton, CA (US); Bharath Rangarajan, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 97 days.

This patent is subject to a terminal disclaimer.

(21) Appl. No.: 09/788,905

(22) Filed: Feb. 20, 2001

(51) Int. Cl.[7] .............................................. G01B 11/00
(52) U.S. Cl. ........................ 356/400; 356/401; 430/22; 430/30
(58) Field of Search ................................ 356/400, 401; 430/22, 30; 250/548

(56) References Cited

U.S. PATENT DOCUMENTS

| 4,595,295 A | 6/1986 | Wilczynski | |
|---|---|---|---|
| 4,677,301 A | 6/1987 | Tanimoto, et al. | |
| 4,769,523 A | 9/1988 | Tanimoto, et al. | |
| 4,849,313 A | * 7/1989 | Chapman et al. | 355/53 |
| 5,048,178 A | 9/1991 | Bindra, et al. | 29/830 |
| 5,231,471 A | 7/1993 | Torigoe | 356/401 |
| 5,250,983 A | * 10/1993 | Yamamura | 355/125 |
| 5,262,258 A | * 11/1993 | Yanagisawa | 430/22 |
| 5,272,501 A | 12/1993 | Nishi, et al. | |
| 5,377,009 A | 12/1994 | Kitaoka, et al. | 356/401 |
| 5,444,538 A | 8/1995 | Pelligrini | 356/401 |
| 5,552,251 A | * 9/1996 | Hwang | 353/41 |
| 5,635,336 A | 6/1997 | Bae | 430/314 |
| 5,656,229 A | 8/1997 | Tanimoto, et al. | |
| 5,699,260 A | 12/1997 | Lucas, et al. | |
| 5,715,063 A | 2/1998 | Ota | 356/400 |
| 5,733,690 A | * 3/1998 | Jeong et al. | 430/22 |
| 5,747,200 A | 5/1998 | Ip, et al. | 430/22 |
| 5,766,809 A | 6/1998 | Bae | 430/22 |
| 5,837,404 A | * 11/1998 | Lu | 430/5 |
| 5,868,560 A | * 2/1999 | Tamada et al. | 430/22 |
| 6,018,395 A | 1/2000 | Mori, et al. | 356/401 |
| 6,071,656 A | * 6/2000 | Lin | 430/22 |
| 6,269,322 B1 | 7/2001 | Templeton, et al. | |

FOREIGN PATENT DOCUMENTS

| EP | 0226905 | 12/1986 |
|---|---|---|
| EP | 0358425 | 9/1989 |
| EP | 0895279 | 3/1996 |
| WO | 0129618 | 4/2001 |

* cited by examiner

*Primary Examiner*—Michael G. Lee
*Assistant Examiner*—Steven S. Paik
(74) *Attorney, Agent, or Firm*—Amin & Turocy, LLP

(57) ABSTRACT

The present invention relates to wafer alignment. A reticle is employed which includes, a design, and a first and second set of scribe marks. The first and second sets of scribe marks have an associated symmetry relative to the reticle design. The design and scribe marks are printed at selected field locations on a surface layer of the wafer. The first and second sets of scribe marks as printed at adjacent fields on the surface layer of wafer form a composite set of scribe marks. The symmetric relationship between the first and second sets of scribe marks results in the composite set of scribe marks substantially negating print errors of the marks due to reticle rotation and/or lens magnification with respect to a geometric reference point of the composite set of scribe marks. The employment of the composite set of scribe marks, such as to locate a corresponding virtual alignment mark, substantially facilitates mitigation of overlay error in wafer alignment.

36 Claims, 5 Drawing Sheets

SYSTEM AND METHOD FOR FACILITATING WAFER ALIGNMENT BY MITIGATING EFFECTS OF RETICLE ROTATION ON OVERLAY

TECHNICAL FIELD

The present invention generally relates to semiconductor processing, and in particular to a system and method for facilitating wafer alignment by mitigating effects of reticle rotation on overlay.

BACKGROUND OF THE INVENTION

The tendency of semiconductor devices such as integrated circuits (IC) and large scale integrated circuits (LSIC) toward minuteness has rapidly progressed, and higher accuracy has been required of apparatuses for manufacturing such semiconductor devices. In particular, such requirements are demanded from exposure devices in which a circuit pattern of a mask or a reticle is superposedly transferred onto a circuit pattern formed on a semiconductor wafer. It is desired that the circuit pattern of the mask and the circuit pattern of the wafer be superposed one upon the other with accuracies of, for example, less than 0.1 $\mu$m.

Semiconductor integrated circuits undergo a variety of processing steps during manufacture, such as masking, resist coating, etching, and deposition. In many of these steps, material is overlayed or removed from the existing layer at specific locations in order to form desired elements of the integrated circuit. Proper alignment of the various process layers is important. The shrinking dimensions of modern integrated circuits require increasingly stringent overlay alignment accuracy. If proper alignment tolerances are not achieved, device defects can result.

More particularly, during fabrication of an IC, a wafer lithography system projects a pattern of light onto a photoresist layer of a wafer. The projected light changes properties of exposed portions of the photoresist layer such that a subsequent development process forms a mask from the photoresist layer which exposes or protects different portions of the wafer. The masked wafer is then removed to a reaction chamber where a process such as etching changes the exposed portions of the wafer. Typically, a wafer lithography system forms several masks on a wafer during an IC fabrication process, and the masks must be aligned with each other to form a working IC.

A wafer stepper typically is used to align the wafer during the various process steps. The wafer stepper uses one of a number of commercially available techniques to generate alignment signals which indicate position relative to the wafer. The alignment signals typically are produced by optical measurement of alignment marks placed at specified locations on the wafer. A reticle is used to place the appropriate marks on a particular wafer process layer such that the marks can be readily identified by the wafer stepper in subsequent processing steps. The reticle includes a pattern which can be etched into the wafer using optical photolithography. Commonly used alignment mark techniques include Laser Step Alignment (LSA), Field Image Alignment (FIA), Laser Interferometric Alignment (LIA), Global Alignment Mark (GAM), and Global Alignment Mark Laser Step Alignment (GAMLSA). In a step-and-repeat type apparatus, the wafer is moved in steps by predetermined distances. For example, the wafer typically is placed on a two-dimensionally moveable stage and positioned relative to a projected image of a reduction projection type exposure apparatus.

Some types of alignment systems and/or methods employ large global alignment marks to align the wafer. For such systems and/or methods, a reticle includes a design pattern and an alignment mark. The alignment mark is typically located outside of the design pattern, although the alignment mark could be located within the design region but at the expense of sacrificing design area real estate. The design pattern and alignment mark are printed at several predetermined fields of a wafer. These printed alignment marks are found by a stepper system and are employed in wafer alignment, for example, for subsequent processing.

Another type of alignment system utilizes a reticle having scribe lines located along a perimeter portion of the design area. Usually, two sets of scribe lines are printed respectively along two adjacent sides of the design area, with each set of scribe lines having a standard pitch. The scribe lines and design pattern are printed at several predetermined fields of the wafer during a step-and-repeat process. The printed scribe lines extend between each adjacent field. A stepper system locates, for example, a centroid for a selected set of scribe lines to facilitate alignment between the reticle and the wafer in subsequent processing.

However, the reticle may have been positioned in the projection system with a slight rotation and/or the reticle may include rotation errors due to the scribe lines and associated design pattern being slightly rotated or shifted (for example, as a result of error in the process of manufacturing the reticle). The errors due to rotation or shifting of the scribe lines and design pattern become greatly exaggerated as one moves away from the center of the reticle. Another type of error is lens magnification error wherein the image (scribe lines and/or design pattern) is slightly over-magnified or under-magnified with respect to an intended magnification level. The reticle rotation error and/or lens magnification error result in the scribe lines being printed at locations different from intended. Consequently, the centroid position which is used for alignment purposes also includes position errors proportional to the reticle rotation error.

SUMMARY OF THE INVENTION

The present invention relates to a system and method for facilitating wafer alignment by mitigating overlay error in the production of semiconductor devices.

One aspect of the present invention relates to a method for determining a reference point on a wafer. A composite set of scribe marks is formed from a first and second set of scribe marks. The composite set of scribe marks has a geometric characteristic which substantially negates rotational error associated with a reticle employed in a lithographic printing process.

Another aspect of the present invention relates to a method for facilitating wafer alignment using a reticle. The reticle includes a design area, a first set of scribe marks, and a second set of scribe marks symmetric to the first set of scribe marks relative to the design area. The first and second sets of scribe marks are printed on a surface layer of the wafer associated with a first field location. The first and second sets of scribe marks are printed on the surface layer of the wafer associated with a second field location adjacent to the first field location, such that the first set of printed scribe marks of the first field location and the second set of printed scribe marks of the second field location form a composite set of printed scribe marks, which substantially negates rotational error associated with the reticle employed in a lithographic printing process.

Still another aspect of the present invention relates to a reticle for use in a lithographic process. The reticle includes a design area, a first set of scribe marks located along a first side of the design area, and a second set of scribe marks located along a second side of the design area opposite the first side. The first and second sets of scribe marks have an associated symmetry relative to the design area such that, upon being printed onto adjacent fields of a wafer, the first set of printed scribe marks of one of the adjacent fields and the second set of printed scribe marks of another of the adjacent fields reticulate to form a composite set of printed scribe marks, which substantially negates rotational error associated with the reticle employed in a lithographic printing process.

Yet another aspect of the present invention relates to a system for facilitating wafer alignment. The system includes a reticle including a design area, a first set of scribe marks located along a first side of the design area, and a second set of scribe marks located along a second side of the design area symmetric to the first set of scribe marks relative to the design area. The system includes at least one system for locating a composite set of scribe marks as printed on a surface layer of the wafer, the composite set of scribe marks being formed by aggregating the first set of scribe marks as printed on the surface layer associated with a first field location and the second set of second marks as printed on the surface layer associated with a second field location adjacent to the first field location. A processor controls general operations of the at least one system and determines a geometric characteristic of the composite set of printed scribe marks. The processor employs the geometric characteristic to facilitate alignment of the wafer.

Another aspect of the present invention relates to a system for aligning a wafer. The system includes means for locating a composite set of scribe marks on a surface layer of the wafer, the composite set of scribe marks being formed from a first and second set of scribe marks printed on the surface layer of the wafer respectively associated with first and second adjacent fields, the first and second sets of printed scribe marks having an associated symmetry such that the composite set of scribe marks substantially negates reticle rotation error. The system also includes means for determining a geometric characteristic of the composite set of scribe marks, the geometric characteristic being a virtual alignment mark, and means for aligning the wafer using the virtual alignment mark as a reference.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
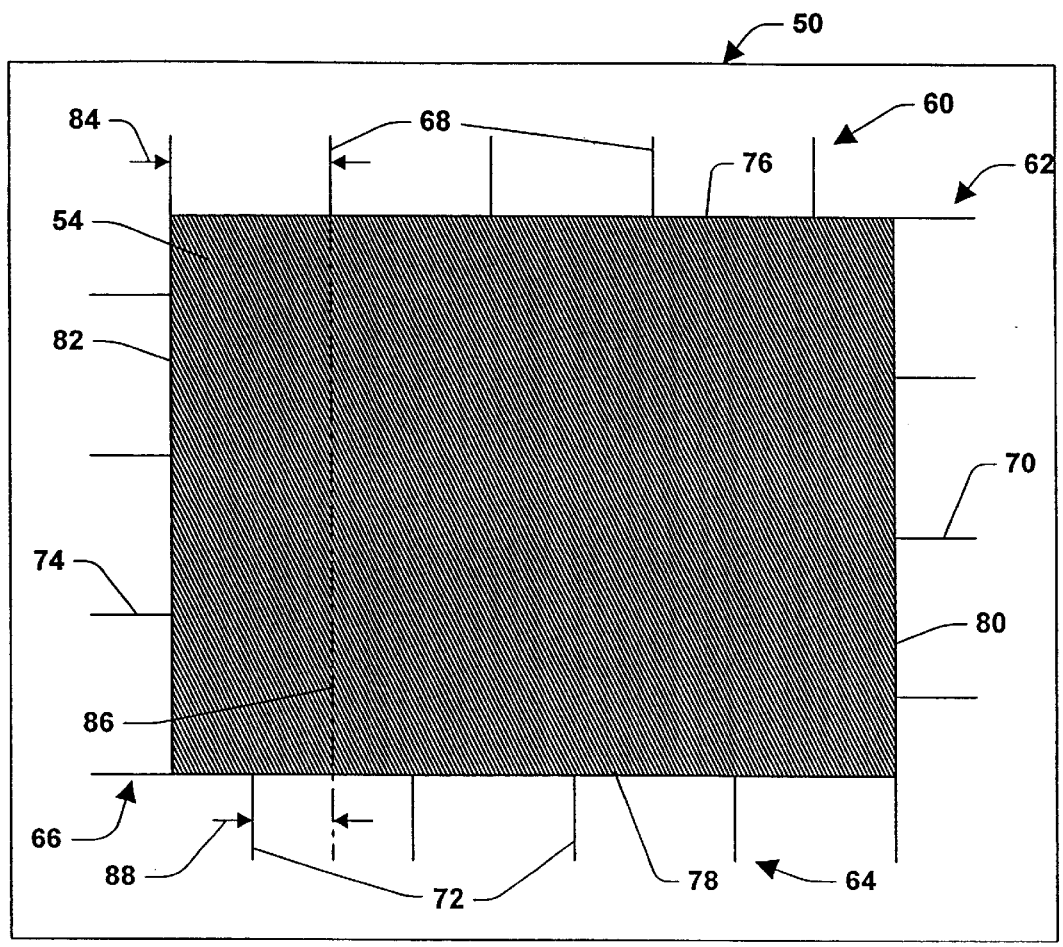
FIG. 1 is a schematic illustration of a reticle having scribe marks in accordance with the present invention.

The present invention will now be described with reference to the drawings, wherein like reference numerals are used to refer to like elements throughout.

FIG. 1 is a representative schematic illustration of a reticle 50 in accordance with the present invention. The reticle 50 includes a design pattern 54 located at a substantially central region of the reticle 50. The design pattern 54 is typically imaged via an exposure source (such as light, x-rays, an electron beam or other electromagnetic energy) passing through the reticle 50 onto an exposure area of a wafer. The exposure source alters regions of a photoresist on the wafer exposed according to the design pattern 54 of the reticle 50. The reticle 50 also includes four sets 60, 62, 64, 66 of associated scribe marks 68, 70, 72, 74, respectively, located outside the design pattern to maximize design space utilization. Each respective set of scribe marks 60, 62, 64, 66 is disposed along an associated side 76, 78, 80, 82 of the design pattern 54. Selected sets of the scribe marks are employed to facilitate wafer alignment.

By way of example, opposed sets of scribe marks 60, 64 and 62, 66 are symmetric to each other relative to the design pattern 54, with the respective scribe marks 68, 72 and 70, 74 of each opposed set extending parallel to each other. Each set of scribe marks preferably has a predetermined pitch 84 (indicated only with respect to set 60 for ease of illustration). That is, each scribe mark 68, 72, 70, 74 is spaced apart from each adjacent scribe mark of its associated set 60, 64, 62, 66 by a distance defined by the pitch length 84. In addition, each scribe mark is offset from a corresponding one of the scribe marks of the opposed set by about ½ the predetermined pitch length 84. The offset is illustrated in FIG. 1 by extending a line from the scribe mark 68 to a location substantially midway between an adjacent pair of scribe marks 72 of the opposed set of scribe marks 64. The offset between line 86 and an adjacent scribe mark 72, which offset is indicated at 88, is equal to about ½ the pitch 84. The symmetrical relationship and the offset between each opposed set of scribe marks 60, 64 and 62, 66 are utilized to form composite sets of scribe marks when printed at selected fields of a wafer.

For purposes of brevity and ease of illustration, a relatively small number of scribe marks (five marks along each horizontal side and four marks along each vertical side) are shown along each side 76, 78, 80, 82 of the design pattern 54. It will be appreciated that any number of scribe marks (greater or lesser than shown) may be implemented in accordance with the present invention. Additionally, while the scribe marks of each opposed set are illustrated as substantially parallel lines, it will be appreciated that other configurations and relative arrangements of scribe marks could be used.

Figure 2:
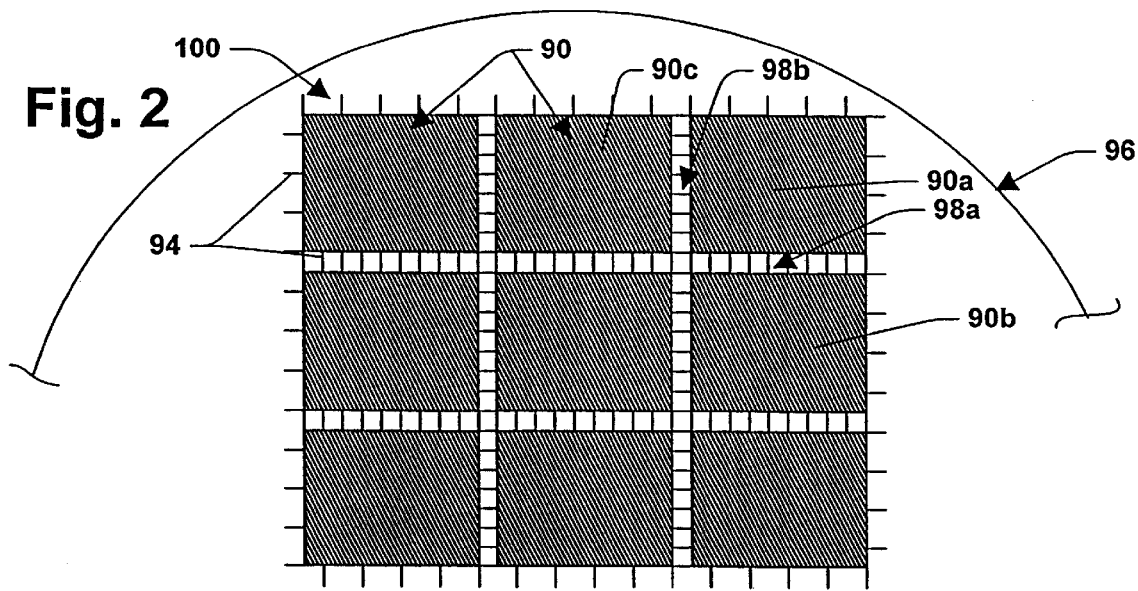
FIG. 2 is a schematic illustration of a wafer surface layer having design areas and scribe marks as printed from the reticle of FIG. 1 in accordance with the present invention.

FIG. 2 is a schematic representation of several design patterns 90 and associated scribe marks 94 printed on a surface layer of a wafer 96 at selected fields. Each printed design pattern 90 corresponds to the design pattern 54 from the reticle 50 (FIG. 1) as printed during a photolithography process. The scribe marks 94 associated with adjacent pairs of printed design patterns 90 reticulate (i.e., interleave or mesh) to form composite sets of scribe marks 98. In particular, each composite set of scribe marks 98 comprises alternating scribe marks from each adjacent constituent set of scribe marks. That is, each composite set of scribe marks 98 is an aggregate of two adjacent sets of scribe marks as printed with an adjacent pair of design patterns.

For example, the composite set of scribe marks 98a is an aggregate of the bottom set of scribe marks associated with design pattern 90a and the top set of scribe marks associated with design pattern 90b (top and bottom being used to describe relative positions between design patterns for ease of understanding). Similarly, the composite set of scribe marks 98b is an aggregate of the left set of scribe marks associated with design pattern 90a and the right set of scribe marks associated with design pattern 90c (left and right being used to describe relative positions between design patterns for ease of understanding). Each composite set of printed scribe marks 98 has a pitch defined by the aggregation of scribe marks that form the respective composite set. In contrast, each set of scribe marks 100 printed at the perimeter of the wafer 96 (i.e., nearest the edge of the wafer 96) have twice the pitch of each composite set of scribe marks 98, since its scribe marks only include those from a single set of scribe marks.

Reticle rotation errors and/or lens magnification errors which typically manifest in sets of scribe marks being printed at locations on the wafer surface level (a particular photoresist layer) different from desired locations are substantially negated by the composite sets of scribe marks 98. As stated above, this is the result of the symmetry and offset of opposed sets of scribe marks 60, 64 and 62, 66 of the reticle 50 (FIG. 1). Although reticle rotation and/or lens magnification errors manifest in each printed set of scribe marks individually, the errors are substantially negated with respect to each composite set of scribe marks. By using one or more selected composite sets of scribe marks to define a corresponding reference mark for wafer alignment, overlay errors due to reticle rotation and/or lens magnification/demagnification are substantially mitigated.

Figure 3A:
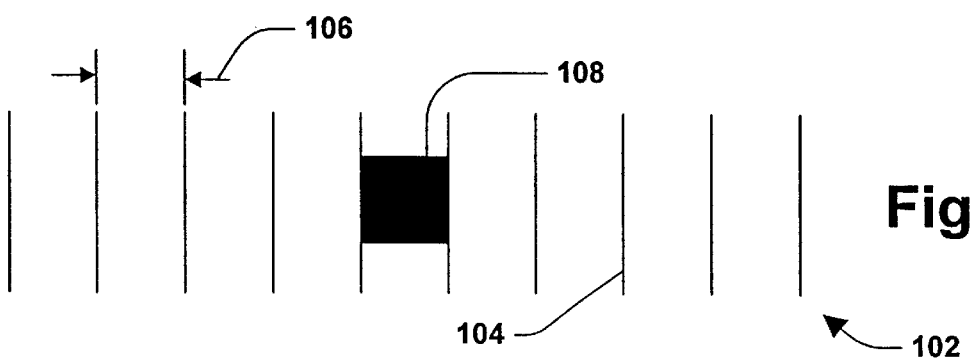
FIG. 3a is an enlarged schematic illustration of a first horizontal set of scribe marks from FIG. 2 showing a reference point thereof.

FIG. 3a illustrates, for example, an enlarged view of a set of printed scribe marks 102, such as extending from the bottom side of a printed design pattern (90a of FIG. 2). The set 102 includes individual scribe marks 104 having a predetermined pitch, indicated at 106. The set of scribe marks 102 has a geometric reference point (e.g., a centroid position) indicated by a square 108, which may be geometrically determined by a stepper system (not shown). The position of the geometric reference point 108 varies as a function of the location and configuration of the scribe lines 104.

Figure 3B:
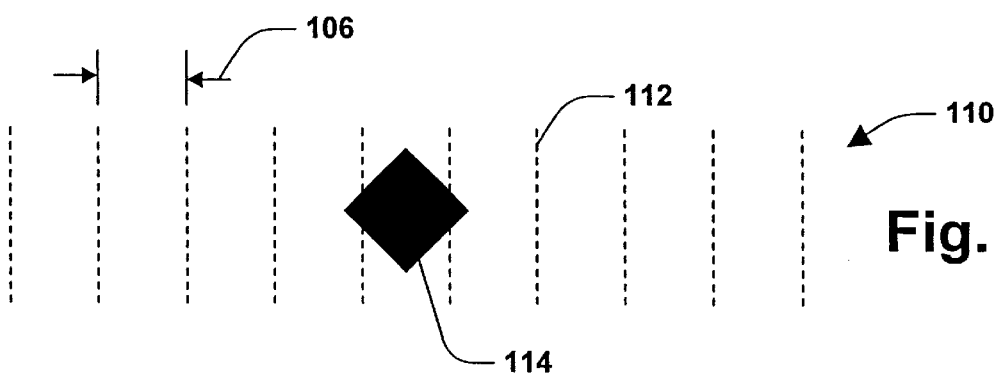
FIG. 3b is an enlarged schematic illustration of a second horizontal set of scribe marks from FIG. 2 showing a reference point thereof.

FIG. 3b illustrates another set of printed scribe marks 110 of an adjacent field, for example, extending from the top side of a printed design pattern (90b of FIG. 2). For purposes of ease of illustration, individual scribe marks 112 of set 110 are shown as dashed lines to distinguish from the solid scribe marks 104 of FIG. 3a. The set of scribe marks 110 has a geometric reference point (e.g., a centroid), as indicated by diamond 114, which varies as a function of scribe marks 112. The set 110 has the same predetermined pitch 106 as the set 102 of FIG. 3a. Each scribe mark 112 is offset from a corresponding scribe mark 104 of the other set 102 (FIG. 3a) by about ½ the predetermined pitch 106. The offset between the scribe marks 104 and 112 is imparted during printing of the adjacent design patterns 90a and 90b with the reticle 50 (FIG. 1). The set of printed scribe marks 102 of FIG. 3a, for example, corresponds to scribe marks printed from set 64 of the reticle associated with a first design pattern 90a (FIGS. 1 and 2) and the set of printed scribe marks 110 of FIG. 3b correspond to scribe marks printed from the set 60 of the reticle associated with a second design pattern 90b (FIGS. 1 and 2).

Figure 3C:
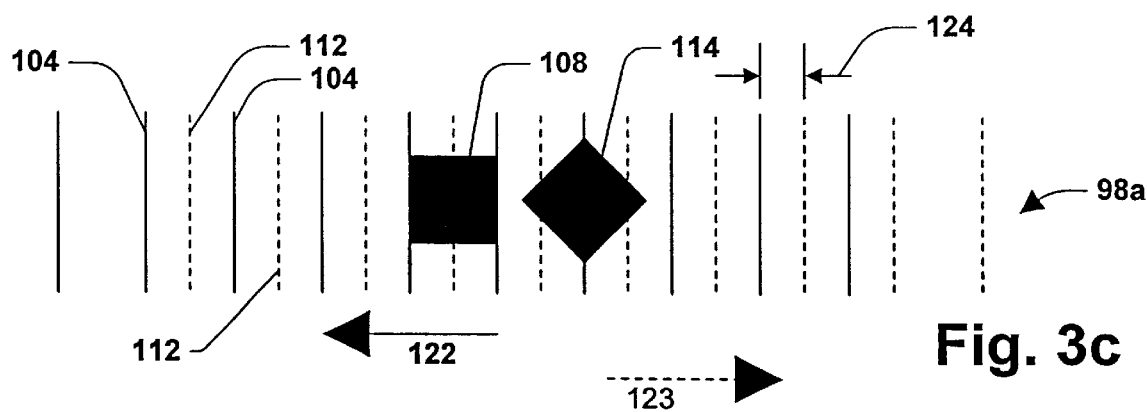
FIG. 3c is a schematic illustration of a composite set of scribe marks formed of the first and second sets of scribe marks of FIGS. 3a and 3b, wherein reticle rotation error resulted in each sets of scribe marks being shifted.

FIG. 3c illustrates the composite set of printed scribe marks 98a which is an aggregate of sets 102, 110 (FIGS. 3a, 3b). The relative orientation (offset) between the scribe marks 104, 112 of each respective set 102, 110 results in the composite set of scribe marks 98a being formed of alternating scribe marks 104, 112 from each constituent set. This results in the composite set of scribe marks 98a having a pitch 124 that is typically about ½ the pitch 106 of its constituent sets. Arrows 122, 123 illustrate the direction that each respective constituent set of scribe marks 102, 110 might shift when printed due to reticle rotation error. The centroid 108, 114 of each respective set 102, 110 also shifts in the direction of the respective arrows 122, 123, as each centroid varies as a function of the position of the respective scribe mark 104, 112. It will be appreciated that the amount of shifting in each direction 122, 123 has been exaggerated for ease of illustration. The amount of shifting usually will be substantially less than that shown. It will be appreciated that, in addition to such shifting, each set of scribe marks 102, 110 might also experience a slight angular shift due to reticle rotation error. Such angular rotation of each set of scribe marks has been omitted from FIGS. 3c and 3d for purposes of ease of illustration.

Figure 3D:
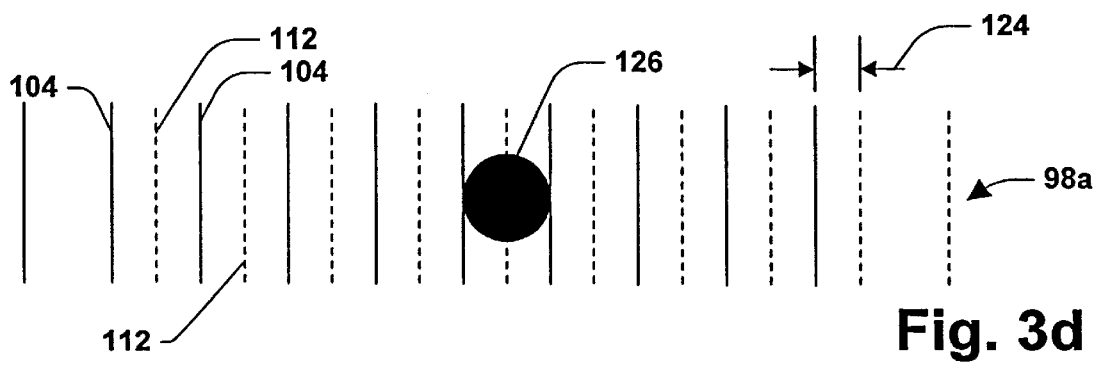
FIG. 3d is a schematic illustration of the composite set of scribe marks of FIG. 3c, illustrating a reference point of the composite set of scribe marks in accordance with the present invention.

Because each set of scribe marks 102, 112 is formed from scribe marks which are offset from each other and located symmetrically on opposite sides (e.g., the top and bottom sides) of the reticle design pattern 54 (FIG. 1), the effects of reticle rotational error for each set of scribe marks 102, 112 occur in substantially opposite directions and equal magnitudes. As a result, the composite set of scribe marks 98a substantially negates the effects of such rotation. Referring to FIG. 3d, the composite set of scribe marks 98a has a centroid 126, which is the aggregate of the centroids 108, 114 of its respective constituent sets 102, 110. Because each of the centroids 108, 114 shifts in opposite directions in response to reticle rotation error, the aggregation thereof (as it exists in centroid 126) substantially negates such error.

Therefore, the composite centroid 126 provides a point of reference for wafer alignment which is substantially free of errors manifesting from reticle rotation and/or lens magnification.

Figure 4A:
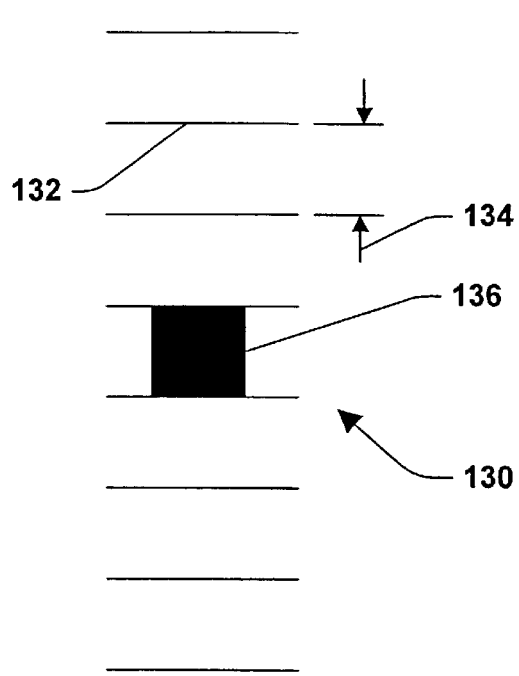
FIG. 4a is an enlarged schematic illustration of a first vertical set of scribe marks from FIG. 2 showing a reference point thereof.

FIGS. 4a–4d illustrate formation of another composite set of scribe marks from two different sets of printed scribe marks, such as, for example, the composite set of scribe marks 98b extending vertically between adjacent printed design patterns 90a and 90c (FIG. 2). The formation of the composite set 98b is substantially identical to that of FIGS. 3a–3d. Briefly stated, FIG. 4a illustrates an enlarged view of a set of printed scribe marks 130, suitably formed of scribe marks 132 extending from the left side of a printed design pattern 90a (FIG. 2). The set of scribe marks 130 has a predetermined pitch, indicated at 134, which may be the same as the pitch 106. The set of scribe marks 130 also has a geometric reference point (e.g., a centroid position), indicated by a square 136, which varies as a function of the scribe marks 132.

Figure 4B:
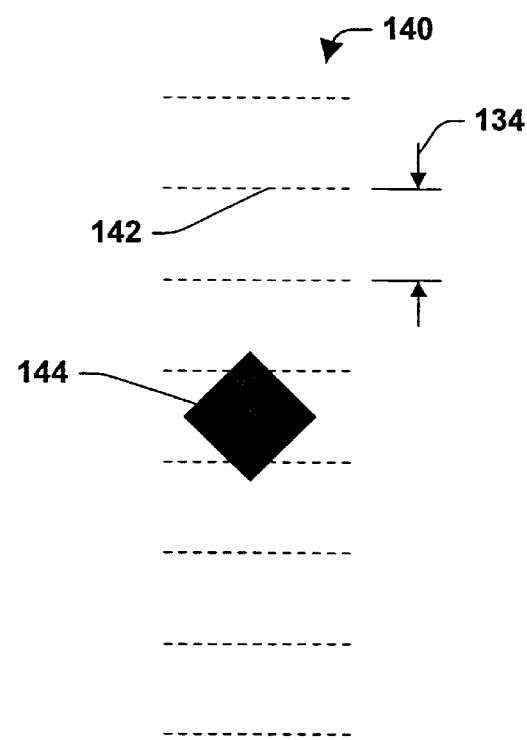
FIG. 4b is an enlarged schematic illustration of a second vertical set of scribe marks from FIG. 2 showing a reference point thereof.

FIG. 4b illustrates another set of printed scribe marks 140 that includes scribe marks 142 which, for example, extend from the right side of an adjacent printed design pattern 90c (FIG. 2). While, for purposes of ease illustration, individual scribe marks 142 are shown as dashed lines, it will be appreciated that both sets 130 and 140 typically (although not necessarily) are solid lines. The set of scribe marks 140 has the same predetermined pitch 134 as the set 130 of FIG. 4a. Preferably, each scribe mark 142 is printed at an offset from relative to a corresponding scribe mark 104 of the other set 130 (FIG. 3a), such as being offset by ½ the pitch 134. The offset results from employing the reticle 50 (FIG. 1) configured with opposed sets of scribe marks 62 and 66 having an associated symmetry and a selected offset, as previously described with respect to FIG. 1. The set of scribe marks 140 has a geometric reference point (e.g., centroid position), indicated by diamond 144, which varies as a function of the constituent scribe marks 142.

Figures 4C, 4D:
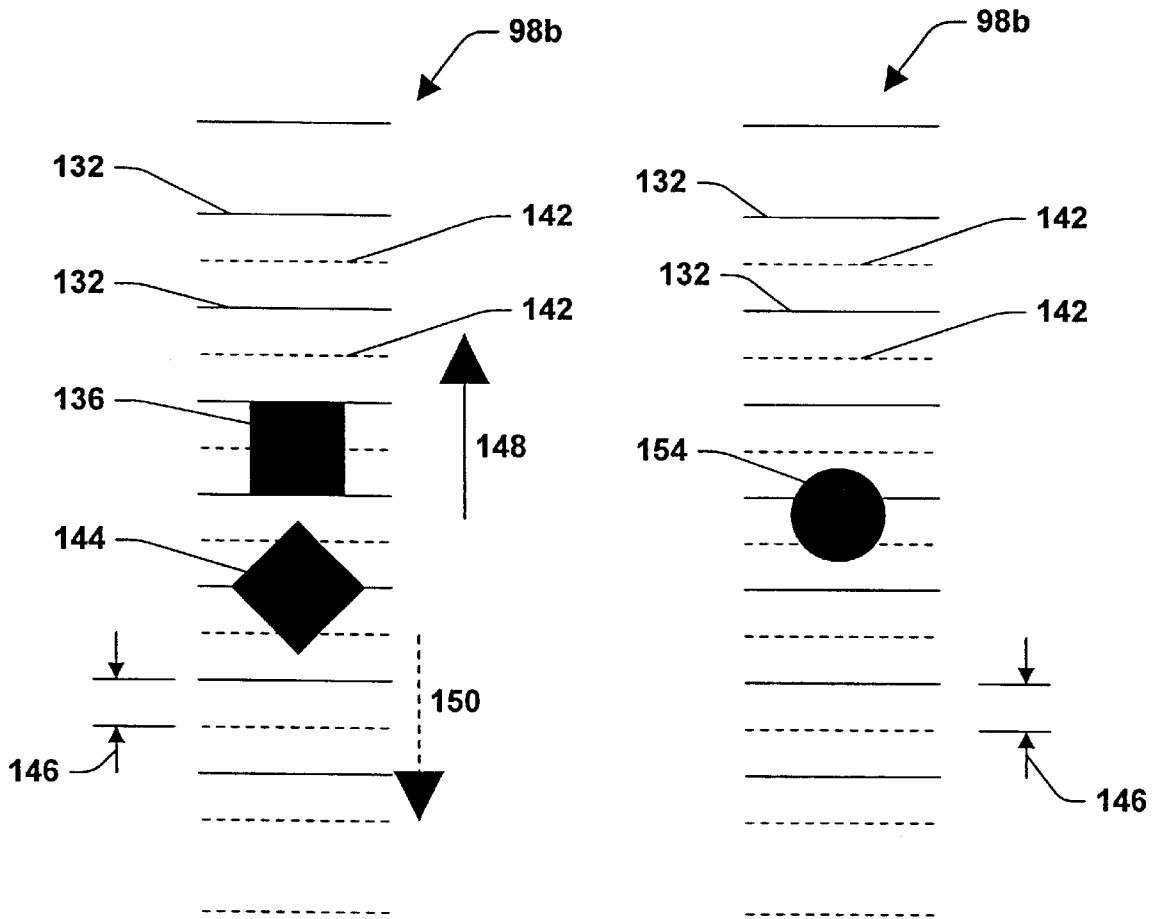
FIG. 4c is a schematic illustration of a composite set of scribe marks formed of the first and second sets of scribe marks of FIGS. 4a and 4b, wherein reticle rotation error resulted in each set of scribe marks being shifted.
FIG. 4d is a schematic illustration of the composite set of scribe marks of FIG. 4c, illustrating a reference point of the composite set of scribe marks in accordance with the present invention.

FIG. 4c is a schematic illustration of the composite set of scribe marks 98b formed by aggregating the sets of scribe marks 130 and 140. The symmetric relationship and offset between the scribe marks 132, 142 of each respective set 130, 140 result in the scribe marks 132, 142 reticulating (i.e., interleaving or meshing) to form the composite set of scribe marks 98b, which includes alternating scribe marks 132 and 142 from each respective set. The offset between each set of scribe marks 130, 140 provides the composite set of scribe marks 98b with a pitch 146 that is about the pitch 134 of each of its constituent sets. Arrows 148, 150 have been added to illustrate the direction that each respective constituent set of scribe marks 130, 140 may shift due to reticle rotation error. The amount of shifting in each direction again has been exaggerated for ease of illustration. It will be appreciated that each centroid 136, 144 shifts in the direction of the respective arrows 148, 150 commensurate with such rotation error. Under ideal operating conditions, the offset between centroids should be equal to the distance (offset) between an adjacent pair of printed scribe marks (e.g., about ½ pitch of either set when having equal pitches).

FIG. 4d illustrates a centroid 154 of the composite set of scribe marks 98b. The centroid 154 may be determined by aggregating the centroids 136, 144 of each constituent set 130, 140, such as the midpoint between the centroids. Alternatively, the centroid or another geometric characteristic of the composite set of scribe marks 98b may be calculated from the location of the individual scribe marks 132 and 142 that form the composite set of scribe marks 98b.

As stated above, the composite set of scribe marks 98b substantially negates the effects of reticle rotation error. In particular, reticle rotation error causes each set of scribe marks 130, 140 to shift in substantially equal amounts and in opposite directions due the symmetrical relationship and offset which is provided by the corresponding sets of scribe marks of the reticle 50. As a result, the centroid 154 of the composite set of scribe marks 98b compensates for the shifting of each constituent set of scribe marks 130, 140, such that the effects of reticle rotation error are substantially negated. Thus, composite centroid 154 provides a point of reference for wafer alignment which is substantially free of errors manifesting from reticle rotation and lens magnification.

Figure 5:
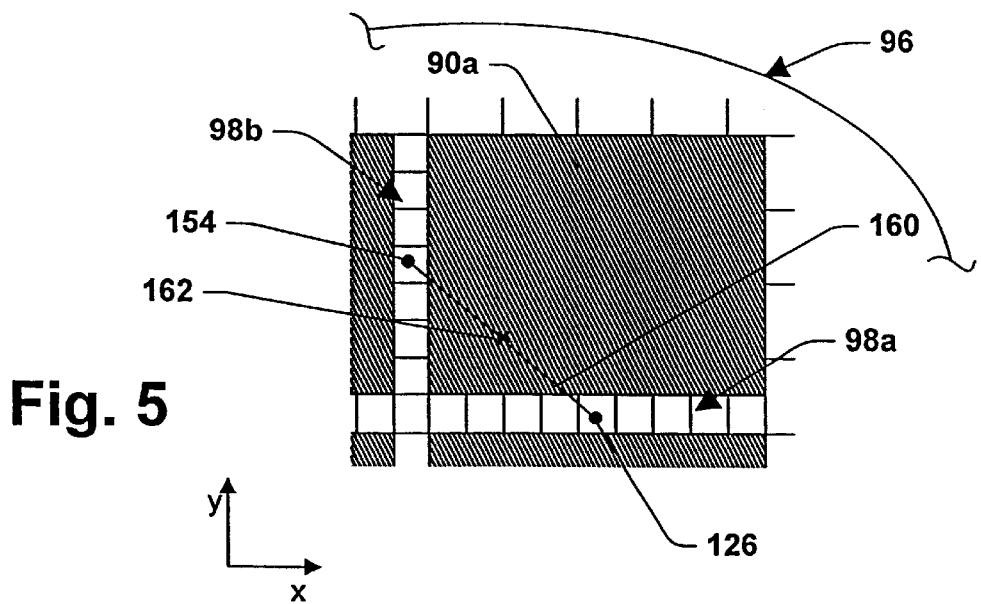
FIG. 5 is an enlarged view of part of FIG. 2 illustrating the location of a virtual alignment mark formed from the reference points of two sets of composite scribe marks in accordance with the present invention.

FIG. 5 is an enlarged view of part of the wafer 96 of FIG. 2 to illustrate the composite sets of scribe marks 98a and 98b located along adjacent sides of the design pattern 90a. Each composite set of scribe marks 98a, 98b has a respective centroid 126, 154. As stated above, the centroid 126, 154 of each composite set of scribe marks 98a, 98b mitigates reticle rotation error manifested by shifting the sets of scribe marks 102, 110 and 130, 140 (FIGS. 3a–4d) that form each respective composite set of scribe marks 98a, 98b. Accordingly, the centroids 126 and 154 may be used as reference points for determining a virtual alignment mark to facilitate relative alignment between the wafer and reticle.

By way of example, a line 160 is drawn to extend between the centroids 126 and 154. A midpoint 162 along the line 160 between the centroids 126 and 154 is employed as a virtual alignment mark 162. The centroid 122 mitigates reticle rotation error in the x-direction and centroid 154 mitigates reticle rotation error in the y-direction. Advantageously, the virtual alignment mark 162 determined from centroids 122 and 154 provides a reference point that is substantially free from the effects of reticle rotation error that occurs in both the x-direction and the y-direction. As a result, the virtual alignment mark 162 may be employed to facilitate mitigation of overlay errors due to reticle rotation and/or lens magnification/demagnification. In order to further mitigate such errors, more than one virtual mark may be determined from selected composite sets of scribe marks in accordance with the present invention.

While for purposes of explanation, the virtual alignment mark has been determined as a function of centroids 126 and 154 located along adjacent sides of a common design pattern 90a, it will be appreciated that a centroid (or other geometric characteristic) could be determined for any composite set of scribe marks associated with any design pattern on the wafer 96. In addition, one or more reference points of any composite set of scribe marks, such as a centroid, could be employed as a virtual alignment mark to facilitate relative alignment between the wafer 96 and reticle 50.

Figure 6:
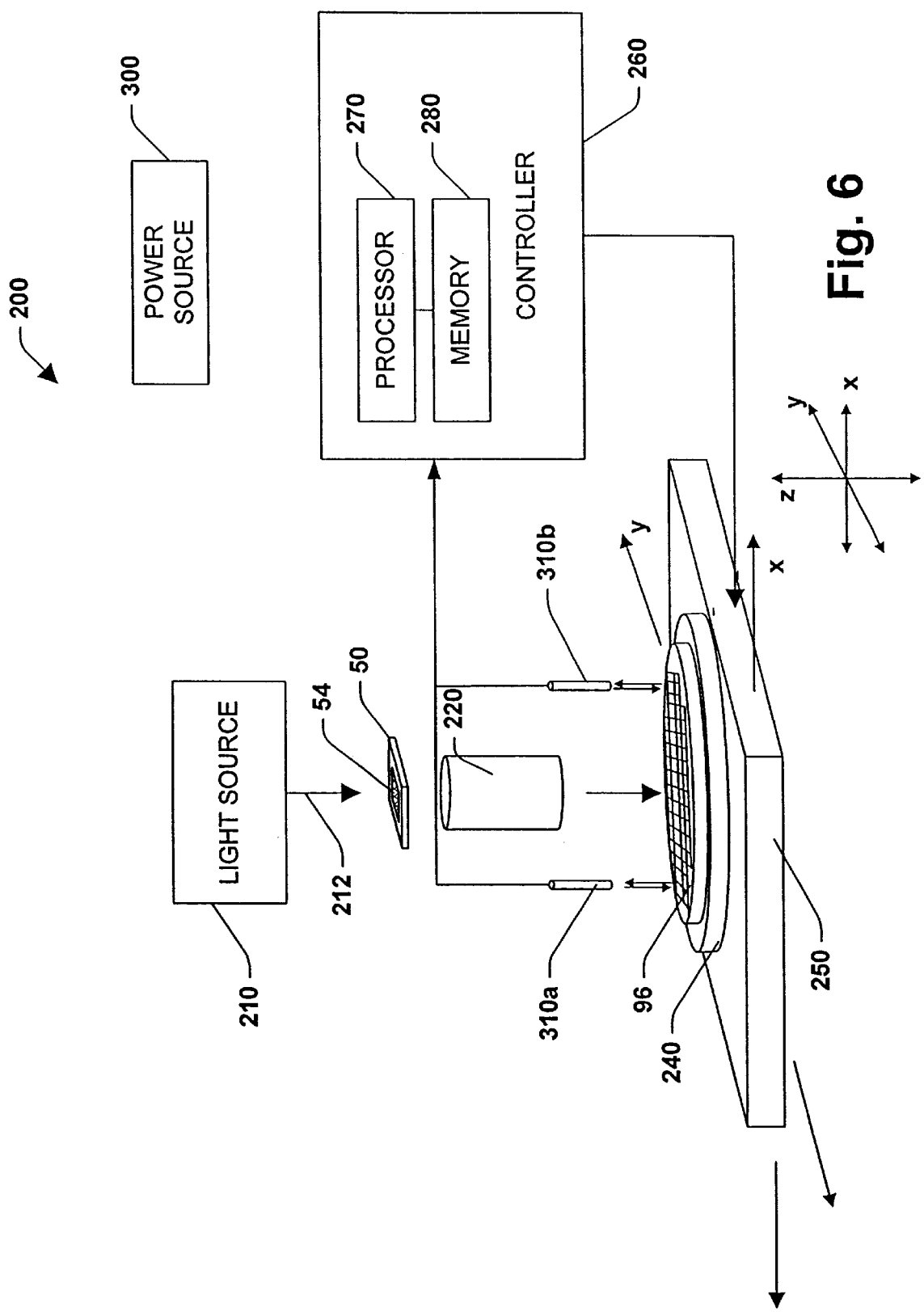
FIG. 6 is a representative schematic illustration of a wafer alignment system in accordance with the present invention.

FIG. 6 is a representative system 200 for wafer alignment in accordance with the present invention. The system 200 includes the reticle 50 with the design pattern 54. A light source 210 projects light 212 through the reticle 50 to so as to project the design pattern 54 onto the wafer 96. The light 212 from the light source 210 passes through the reticle 50 and through the optical axis of a projection lens system 220. The projection lens system 220 projects the design pattern 54 of the reticle 50 onto the wafer 96 while in most cases substantially reducing the imaged design pattern. It is to be appreciated that reflection-type systems, scanning systems and other suitable systems may be employed in carrying out the present invention.

A wafer holder 240 vacuum-adsorbs the wafer 96 and is provided for slight rotation relative to a stage 250 two-dimensionally moveable in an x-direction and y-direction.

The stage 250 and wafer holder 240 are controlled by a controller 260. The controller 260 effects rotation of the wafer holder 240 and movement of the stage 250 (via a plurality of motors (not shown)) for wafer alignment and positioning. The controller 260 includes a processor 270 which is programmed to control and operate the various components within the system 200 in order to carry out the various functions described herein. The manner in which the processor 270 can be programmed to carry out the functions relating to the present invention will be readily apparent to those having ordinary skill in the art based on the description provided herein.

A memory 280 which is operatively coupled to the processor 270 is also included in the controller 260 and serves to store program code executed by the processor 270 for carrying out operating functions of the system 200 as described herein. The memory 280 includes, for example, read only memory (ROM) and random access memory (RAM). The RAM is the main memory into which the operating system and application programs are loaded. The memory 280 also serves as a storage medium for temporarily storing information such as reticle position, wafer position, reticle coordinate tables, wafer coordinate tables, alignment mark information, printed alignment mark information, virtual alignment mark information, programs for determining virtual alignment mark locations and other data which may be employed in carrying out the present invention. For mass data storage, the memory 280 may also include a hard disk drive (e.g., 50 Gigabyte hard drive).

A power source 300 provides operating power to the system 200. Any suitable power source (e.g., battery, line power) may be employed to implement the present invention.

In one specific case, the system 200 further includes off-axis type wafer alignment microscopes 310a and 310b (collectively referred to by reference number 310). The microscopes 310 have optic axes parallel to the optic axis of the projection system 220 and image on the wafer 96 band-like laser light spots (not shown), for example. The band-like laser spots are light of a wavelength which does not activate the photosensitive agent (photoresist) on the wafer 96. Each microscope 310 has a photo-element (not shown) receiving scattered light and diffracted light from the scribe marks printed on the wafer surface (photoresist). The microscopes 310 also include systems for synchronizing and rectifying the photoelectric signal output by the photo-elements, respectively, at the vibration period of the light spot(s) and output an alignment signal corresponding to alignment mark deviation relative to the center of vibration of the light spot(s). It is to be appreciated that the wafer alignment mark positioning systems are evolving rapidly and any suitable positioning system (e.g., through the lens system) may be employed to carry out the present invention and is intended to fall within the scope of the hereto appended claims.

The system 200 employs the microscopes 310 to facilitate finding and mapping the locations of the composite sets of scribe marks 98a and 98b as printed on the surface layer of the wafer 96. Once the location of each composite set of scribe marks 98a, 98b has been mapped, the processor 270 can determine a geometric characteristic (e.g., centroid position) of each respective composite set of scribe marks. The geometric reference point varies as a function of the location and configuration of scribe marks that form each respective composite set. The processor 270 then determines the midpoint of the respective centroids in order to map the virtual alignment mark 162. The processor 210 employs the virtual alignment mark 162 as a reference for wafer alignment. It will be appreciated that the centroids themselves may be used as virtual marks in addition to, or as an alternative to the virtual alignment mark 162 described above.

Wafer alignment systems are well known in the art, and therefore it is to be appreciated that conventional aspects of the system 200 are described herein at a high level or omitted for sake of brevity. One skilled in the art could readily construct a wafer alignment system in accordance with the present invention based on the teachings herein.

It is to be appreciated that a number of geometric relationships exist which the processor 270 may employ in determining the location of a virtual mark, such as from composite sets of scribe marks 98a and 98b, from their centroid positions 126 and 154, respectively, and/or from any other geometric characteristic of one or both composite set of scribe marks. The use of any and all such relationships is intended to fall within the scope of the present invention as defined by the hereto appended claims. The geometric relationship between the composite sets of scribe marks 98a, 98b and/or centroids 126, 154 may be employed by the processor 270 to map a virtual alignment mark in accordance with the present invention so as to facilitate wafer alignment and mitigate overlay error due to reticle rotation errors and/or lens magnification errors. Based on the above description, one skilled in the art could easily program the processor 270 of system 200 to determine a virtual alignment mark in accordance with this embodiment of the present invention.

Since the virtual alignment marks afford for alignment of the wafer with respect to the respective reticle of each virtual alignment mark, reticle rotation errors and/or magnification errors are mitigated on a layer by layer basis, and on a multi-layer basis as well since overlay errors with respect to a given layer will not manifest in compounded overlay errors in subsequently formed layers as sometimes results conventionally.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for determining a reference point on a wafer, comprising the step of:
    forming a composite set of scribe marks from a first and second set of scribe marks, wherein the composite set of scribe marks has a geometric characteristic which substantially negates rotational error associated with a reticle employed in a lithographic printing process.

2. The method of claim 1, wherein each of the first and second sets of scribe marks has a respective centroid, the geometric characteristic of the composite mark being a centroid formed by aggregating the respective centroids of the first and second sets of scribe marks as printed.

3. The method of claim 1, wherein each of the first and second sets of scribe marks is located between first and second adjacent design patterns printed on a surface layer of the wafer.

4. The method of claim 3, wherein the step of forming further includes printing the first set of scribe marks on a surface layer of the wafer associated with the first printed design pattern and printing the second set of scribe marks on the surface layer of the wafer associated with the second printed design pattern, such that the first and second sets of printed scribe marks reticulate to form the composite set of scribe marks.

5. The method of claim 4, wherein the composite set of scribe marks is formed of substantially parallel alternating scribe marks from each of the first and second sets of printed scribe marks.

6. The method of claim 4, wherein the composite set of scribe marks is a first composite set of scribe marks, the method further including the steps of forming a second composite set of scribe marks from a third and fourth set of scribe marks, the second composite set of scribe marks having a geometric characteristic, the geometric characteristics of the first and second composite sets of scribe marks, respectively, being employed to mitigate reticle rotational error.

7. The method of claim 6, further including the steps of determining a virtual reference mark based on the respective geometric characteristics of the first and second composite sets of scribe marks and using the virtual reference mark to facilitate relative alignment between the wafer and reticle.

8. The method of claim 7, wherein the geometric characteristic of each of the first and second sets of scribe marks is a respective centroid, the virtual reference mark is a midpoint between the centroids of the first and second composite sets of scribe marks.

9. The method of claim 6, wherein the third and fourth sets of scribe marks are oriented transverse relative to the first and second sets of scribe marks.

10. The method of claim 6, wherein the first and third sets of scribe marks are printed on the surface layer of the wafer associated with the first printed design pattern, the method further including printing the fourth set of scribe marks on the surface layer of the wafer associated with a third printed design pattern adjacent to the first printed design pattern, such that the third and fourth sets of printed scribe marks reticulate to form the second composite set of scribe marks.

11. A method for facilitating wafer alignment, comprising the steps of:
   using a reticle, including:
      a design area;
      a first set of scribe marks; and
      a second set of scribe marks symmetric to the first set of scribe marks relative to the design area;
   printing the first and second sets of scribe marks on a surface layer of the wafer associated with a first field location; and
   printing the first and second sets of scribe marks on the surface layer of the wafer associated with a second field location adjacent to the first field location such that the first set of printed scribe marks of the first field location and the second set of printed scribe marks of the second field location form a composite set of printed scribe marks which substantially negates rotational error associated with the reticle employed in a lithographic printing process.

12. The method of claim 11, wherein the composite set of printed scribe marks is a first composite set of printed scribe marks, the reticle further including a third and fourth set of scribe marks, the third and fourth sets of scribe marks having an associated symmetry relative to the design area of the reticle, the first step of printing further including printing the third and fourth sets of scribe marks on the surface layer of the wafer associated with the first field location, the method further including printing the third and fourth sets of scribe marks on the surface layer of the wafer at a third field location adjacent to the first field location such that the third set of printed scribe marks of the first field location and the fourth set of printed scribe marks of the third field location form a second composite set of scribe marks which substantially negates reticle rotational error.

13. The method of claim 12, further including the step of determining a respective centroid for each of the first and second composite set of printed scribe marks.

14. The method of claim 13, further including the step of determining a virtual reference mark from the respective centroids of the first and second composite sets of printed scribe marks.

15. The method of claim 14, further including the step of using the virtual reference mark to facilitate relative alignment between the wafer and the reticle, whereby rotational error associated with the reticle employed in a lithographic printing process is mitigated.

16. The method of claim 11, wherein each of the first and second sets of printed scribe marks has a respective centroid, the composite set of printed scribe marks having a centroid which is an aggregate of the respective centroids of the first and second sets of printed scribe marks.

17. The method of claim 16, wherein the first and second sets of printed scribe marks reticulate to form the composite set of scribe marks so that the composite set of scribe marks includes alternating scribe marks from each of the first and second sets of scribe marks.

18. A reticle for use in a lithographic process, comprising:
   a design area;
   a first set of scribe marks located along a first side of the design area; and
   a second set of scribe marks located along a second side of the design area opposite the first side, the first and second sets of scribe marks having an associated symmetry relative to the design area such that, upon being printed onto adjacent fields of a wafer, the first set of printed scribe marks of one of the adjacent fields and the second set of printed scribe marks of another of the adjacent fields reticulate to form a composite set of printed scribe marks on the wafer which substantially negates rotational error associated with employing the reticle in a lithographic printing process.

19. The reticle of claim 18, wherein the first and second sets of scribe marks have a predetermined pitch, each scribe mark of the first set of scribe marks being offset from a corresponding scribe mark of the second set of scribe marks by about one-half the predetermined pitch, wherein the composite set of printed scribe marks has a pitch of about one-half the pitch of the first and second sets of scribe marks as printed.

20. The reticle of claim 18, wherein the composite set of printed scribe marks is a first composite set of scribe marks, the reticle further including a third set of scribe marks located along a third side of the design area, a fourth set of scribe marks located along a fourth side of the design area opposite the third side, the third and fourth sets of scribe marks having an associated symmetry relative to the design area such that, upon being printed onto selected adjacent fields of a wafer, the third set of printed scribe marks of the one of the selected adjacent fields and the second set of printed scribe marks of another one of the selected adjacent fields reticulate to form a second composite set of printed scribe marks on the wafer.

21. The reticle of claim 18, wherein the composite set of printed scribe marks is formed of alternating scribe marks from each of the first and second sets of scribe marks.

22. A method of using the reticle of claim 18, further including the step of forming the composite set of printed scribe marks from the first and second sets of scribe marks, wherein the composite set of printed scribe marks has a geometric characteristic which mitigates rotational error associated with employing the reticle in a lithographic printing process.

23. The method of claim 22, further including the steps of:
 printing the first and second sets of scribe marks on a surface layer of the wafer associated with a first field location; and
 printing the first and second sets of scribe marks on the surface layer of the wafer associated with a second field location adjacent to the first field location so that the first set of printed scribe marks of the first field location and the second set of printed scribe marks of the second field location form the composite set of printed scribe marks for mitigating rotational error associated with the reticle employed in a lithographic printing process.

24. A system for facilitating wafer alignment, comprising:
 a reticle, including:
  a design area;
  a first set of scribe marks located along a first side of the design area; and
  a second set of scribe marks located along a second side of the design area symmetric to the first set of scribe marks relative to the design area;
 at least one system for locating a composite set of scribe marks as printed on a surface layer of the wafer, the composite set of scribe marks being formed by aggregating the first set of scribe marks as printed on the surface of the wafer associated with a first field location and the second set of second marks as printed on the surface of the wafer associated with a second field location adjacent to the first field location; and
 a processor for controlling general operations of the at least one system, the processor determining a geometric characteristic of the composite set of printed scribe marks, the processor employing the geometric characteristic to facilitate relative alignment of the wafer and reticle.

25. The system of claim 24, wherein the geometric characteristic is a centroid of the composite set of printed scribe marks.

26. The system of claim 25, wherein each of the first and second sets of scribe marks as printed has a respective centroid, the centroid of the composite set of printed scribe marks being an aggregate of the respective centroids of the first and second sets of scribe marks.

27. The system of claim 24, wherein the first and second sets of scribe marks have a predetermined pitch, each mark of the first set of scribe marks being offset from a corresponding scribe mark of the second set of scribe marks by about one-half the predetermined pitch, wherein the composite set of printed marks has a pitch of about one-half the pitch of the first and second sets of scribe marks as printed.

28. The system of claim 24, wherein the composite set of printed scribe marks is a first composite set of scribe marks, the reticle further including a third set of scribe marks located along a third side of the design area, a fourth set of scribe marks located along a fourth side of the design area opposite the third side, the third and fourth sets of scribe marks having an associated symmetry relative to the design area, another at least one system for locating a second composite set of scribe marks as printed on the surface layer of the wafer, the second composite set of scribe marks being formed of the third set of scribe marks as printed on the surface of the wafer associated with a third field location and the fourth set of scribe marks as printed on the surface of the wafer associated with a fourth field location adjacent to the third field location.

29. The system of claim 28, wherein the third set of scribe marks as printed associated with the third field location and the fourth set of scribe marks as printed associated with the fourth field location reticulate to form the second composite set of printed scribe marks of alternating scribe marks from each of the third and fourth sets of scribe marks.

30. The system of claim 28, wherein the first and third field locations are the same.

31. A system for aligning a wafer, comprising:
 means for locating a composite set of scribe marks on a surface layer of the wafer, the composite set of scribe marks being formed from a first and second set of scribe marks printed on the surface layer of the wafer respectively associated with first and second adjacent fields, the first and second sets of printed scribe marks having an associated symmetry such that the composite set of scribe marks substantially negates reticle rotation error;
 means for determining the a geometric reference characteristic of the composite set of scribe marks, the geometric reference characteristic being a virtual alignment mark; and
 means for aligning the wafer using the virtual alignment mark as a reference.

32. The system of claim 31, wherein the geometric reference characteristic is a centroid of the composite set of scribe marks.

33. The system of claim 31, wherein the composite set of scribe marks is a first composite set of scribe marks, the system further including means for locating a second composite set of scribe marks on the surface layer of the wafer, the second composite set of scribe marks being formed by aggregating a third and fourth set of scribe marks as printed on the surface layer of the wafer respectively associated with third and fourth adjacent fields.

34. The system of claim 33, wherein the virtual alignment mark is a first virtual alignment mark, the system further including means for determining a geometric reference characteristic of the second composite set of scribe marks, the geometric reference characteristic of the second composite set of scribe marks being a second virtual alignment mark, means for determining a third virtual alignment marks from the first and second virtual alignment marks to facilitate relative alignment between the reticle and the wafer.

35. The system of claim 34, wherein the geometric reference characteristic of the second composite set of scribe marks is a centroid of the second composite set of scribe marks.

36. The system of claim 34, wherein the third virtual alignment mark is a midpoint between the first and second virtual alignment marks.

* * * * *